United States Patent
Fujiwara

(10) Patent No.: US 10,670,472 B2
(45) Date of Patent: Jun. 2, 2020

(54) TEMPERATURE MEASURING MASK AND TEMPERATURE MEASURING METHOD

(71) Applicant: NuFlare Technology, Inc., Yokohama-shi (JP)

(72) Inventor: Kota Fujiwara, Kamakura (JP)

(73) Assignee: NuFlare Technology, Inc., Yokohama-shi (JP)

( * ) Notice: Subject to any disclaimer, the term of this patent is extended or adjusted under 35 U.S.C. 154(b) by 450 days.

(21) Appl. No.: 15/333,966

(22) Filed: Oct. 25, 2016

(65) Prior Publication Data
US 2017/0115167 A1 Apr. 27, 2017

(30) Foreign Application Priority Data
Oct. 27, 2015 (JP) .................................. 2015-211020

(51) Int. Cl.
*G01K 1/14* (2006.01)
*G03F 1/78* (2012.01)
(Continued)

(52) U.S. Cl.
CPC ................ *G01K 1/14* (2013.01); *G03F 1/44* (2013.01); *G03F 1/78* (2013.01); *H02J 7/35* (2013.01);
(Continued)

(58) Field of Classification Search
CPC ..... G01K 1/14; G03F 1/78; G03F 1/44; H02J 7/35; H01J 2237/31793;
(Continued)

(56) References Cited

U.S. PATENT DOCUMENTS 5,407,730 A * 4/1995 Imanaka ................... G01D 3/02
428/209
6,297,984 B1 * 10/2001 Roizin ................ H01L 27/0255
257/E27.103

(Continued)

FOREIGN PATENT DOCUMENTS

JP    60-189272 A    9/1985
JP    10-274676      10/1998

(Continued)

OTHER PUBLICATIONS

Combined Taiwanese Office Action and Search Report dated Mar. 9, 2018 in Taiwanese Patent Application No. 105132950 (with English translation), 11 pages.

(Continued)

*Primary Examiner* — Natalie Huls
*Assistant Examiner* — Janice M Soto
(74) *Attorney, Agent, or Firm* — Oblon, McClelland, Maier & Neustadt, L.L.P.

(57) ABSTRACT

A temperature measuring mask includes: a substrate 10; a temperature sensor 11 being provided to the substrate 10, and being capable of sensing a temperature inside a charged particle beam lithography device 4; a circuit board 12 being provided to the substrate 10, and including a measuring circuit 121A that measures the temperature using the temperature sensor 11 and a storage device 121B that stores measurement data of the measured temperature; a secondary cell 13 being provided to the substrate 10, and supplying electric power to the circuit 121A; and a photoelectric cell 14 being provided to the substrate 10, and generating electric power by being irradiated with an energy beam to charge the secondary cell 13.

19 Claims, 13 Drawing Sheets

(51) Int. Cl.
*G03F 1/44* (2012.01)
*H02J 7/35* (2006.01)
*H01J 37/317* (2006.01)

(52) U.S. Cl.
CPC ..... *H01J 37/3174* (2013.01); *H01J 2237/026* (2013.01); *H01J 2237/30433* (2013.01); *H01J 2237/31793* (2013.01); *Y02E 10/566* (2013.01)

(58) Field of Classification Search
CPC ......... H01J 2237/30433; H01J 37/3174; H01J 2237/026; Y02E 10/566
See application file for complete search history.

(56) References Cited

U.S. PATENT DOCUMENTS

| | | | | |
|---|---|---|---|---|
| 2009/0242545 A1* | 10/2009 | Matsumoto | ............ | G01K 1/026 219/444.1 |
| 2010/0191072 A1* | 7/2010 | Matsumori | .......... | A61B 5/6804 600/301 |
| 2011/0293970 A1* | 12/2011 | Shimura | ............. | H01M 10/465 429/7 |
| 2014/0209818 A1* | 7/2014 | Oishi | .................. | G03F 7/70491 250/492.22 |
| 2015/0176980 A1 | 6/2015 | Jensen et al. | | |

FOREIGN PATENT DOCUMENTS

| | | |
|---|---|---|
| JP | 2007-266079 A | 10/2007 |
| JP | 2009-244174 A | 10/2009 |
| JP | 2011-129673 A | 6/2011 |
| JP | 2013-79882 A | 5/2013 |
| KR | 10-2012-0084792 A | 7/2012 |
| TW | 201102045 A1 | 1/2011 |
| TW | I432708 B | 4/2014 |
| TW | I432709 B | 4/2014 |

OTHER PUBLICATIONS

Combined Office Action and Search Report dated Aug. 2, 2017 in Taiwanese Patent Application No. 105132950 (with English language translation).
Office Action dated Sep. 3, 2018 in corresponding Taiwanese Patent Application No. 105132950 (with English Translation), 7 pages.
Taiwanese Office Action dated Aug. 21, 2019 in Taiwanese Patent Application No. 105132950 (with English translation), 11 pages.
Office Action dated Apr. 5, 2019 in corresponding Japanese Patent Application No. 2015-211020 (with English Translation), 6 pages.
Korean Office Action dated May 19, 2017 in Korean Patent Application No. 10-2016-0137437 (with English translation).
Taiwanese Office Action with machine translation dated Jan. 7, 2020 in corresponding Taiwanese Application No. 105132950 (13 pages).

* cited by examiner

TEMPERATURE MEASURING MASK AND TEMPERATURE MEASURING METHOD

CROSS-REFERENCE TO RELATED APPLICATIONS

This application is based upon and claims the benefit of priority from Japanese Patent Application No. 2015-211020, filed on Oct. 27, 2015, the entire contents of which are incorporated herein by reference.

FIELD

The present invention relates to a temperature measuring mask and a temperature measuring method.

BACKGROUND

In electron beam lithography devices, temperatures of mask substrates having not been subjected to lithography, that is, mask blanks have a great influence on lithography accuracy. Therefore, in a conventional electron beam lithography device, prior to start of lithography on a mask substrate, a temperature measuring mask capable of recovering temperature data is used to measure a temperature of the inside of a chamber. By adjustment of the temperature of the inside of the chamber based on the temperature data, the temperature of the mask substrate is controlled to a predetermined temperature.

In addition, a conventional temperature measuring mask uses a primary cell as a battery.

SUMMARY

However, a conventional temperature measuring mask has a problem of occurrence of particles when a battery case is opened/closed in order to exchange a primary cell. A conventional temperature measuring mask also has a problem of occurrence of an error in temperature measurement due to contact failure etc. caused in exchange of a primary cell.

An object of the present invention is to provide a temperature measuring mask and a temperature measuring method capable of reducing occurrence of particles and measurement errors caused in battery exchange.

A temperature measuring mask of an aspect of the present invention includes: a substrate; a temperature sensor configured to be provided to the substrate, and configured to be capable of sensing a temperature inside a charged particle beam lithography device; a circuit board configured to be provided to the substrate, and configured to include a measuring circuit which measures the temperature using the temperature sensor and a storage device which stores measurement data of the measured temperature; a secondary cell configured to be provided to the substrate, and configured to supply electric power to the circuit; and a photoelectric cell configured to be provided to the substrate, and configured to generate electric power by being irradiated with an energy beam to charge the secondary cell.

The above temperature measuring mask may have a configuration in which the photoelectric cell is bonded to the circuit board so as to overlap with the circuit board in a thickness direction of the substrate, and is thermally separated from the substrate.

The above temperature measuring mask may have a configuration in which a recessed portion in which the circuit board and the photoelectric cell are disposed is provided in an upper surface of the substrate which is orthogonal to the thickness direction, the circuit board is disposed in the recessed portion so as to have a space relative to the inner surface of the recessed portion, the photoelectric cell is bonded, in the recessed portion, to the upper surface of the circuit board, and a heat insulating material is disposed between the lower surface of the photoelectric cell and the bottom surface of the recessed portion.

The above temperature measuring mask may have a configuration in which the photoelectric cell is disposed on a surface of the substrate opposite to the temperature sensor.

The above temperature measuring mask may have a configuration in which a through hole penetrating through the substrate in the thickness direction is provided in the substrate, and the photoelectric cell and the circuit board are disposed in the through hole.

The above temperature measuring mask may have a configuration in which the circuit board is disposed at one end of the inside of the through hole, and the photoelectric cell is disposed at the other end of the inside of the through hole so as to be opposed to the circuit board.

The above temperature measuring mask may have a configuration in which the energy beam is a charged particle beam which is emitted in the charged particle beam lithography device, and the temperature measuring mask further includes a shielding portion configured to shield the photoelectric cell.

The above temperature measuring mask may have a configuration in which a ground of the photoelectric cell is electrically connected to a contact relative to a conductive mask cover which eliminates static electricity on a mask blank.

A temperature measuring method of another aspect of the present invention includes: carrying in, to a charged particle beam lithography device, a temperature measuring mask including a substrate to which a temperature sensor, a circuit board having a circuit, a secondary cell, and a photoelectric cell are provided; irradiating the photoelectric cell with an energy beam to cause the photoelectric cell to generate electric power to charge the secondary cell; sensing a temperature inside the charged particle beam lithography device by using the temperature sensor and outputting a temperature data signal; and operating the circuit with electric power of the secondary cell and receiving the temperature data signal.

In the above temperature measuring method, the energy beam may be a charged particle beam which is emitted in the charged particle beam lithography device, and the photoelectric cell may be shielded.

According to the present invention, occurrence of particles and measurement errors caused in battery exchange can be reduced.

DETAILED DESCRIPTION

Hereinafter, embodiments according to the present invention are described with reference to the drawings. The present invention is not limited to the embodiments.

First Embodiment (Temperature Measuring Mask)

Figure 1:
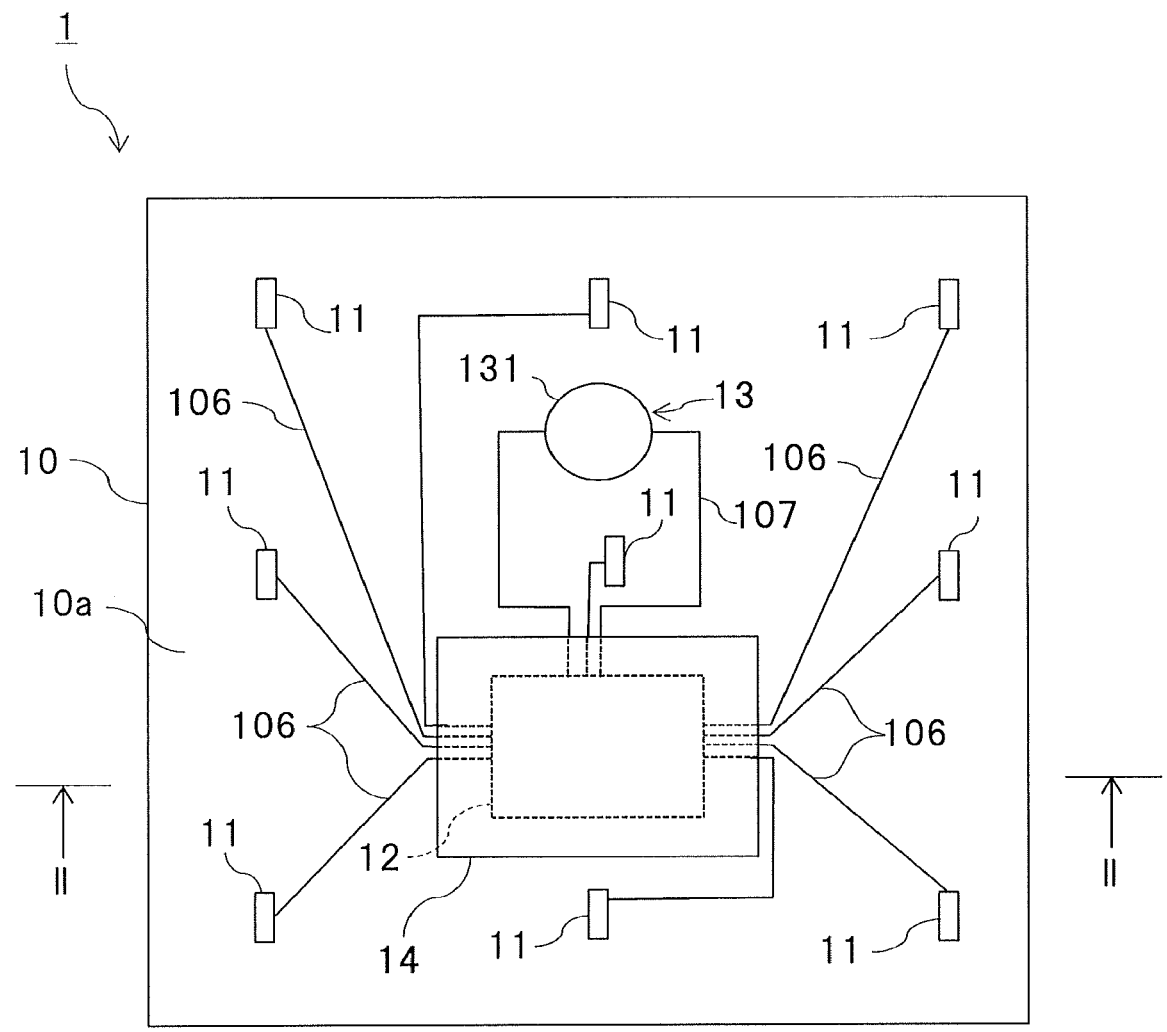
FIG. 1 is a plan view of a temperature measuring mask exemplifying a first embodiment.
Figure 2:
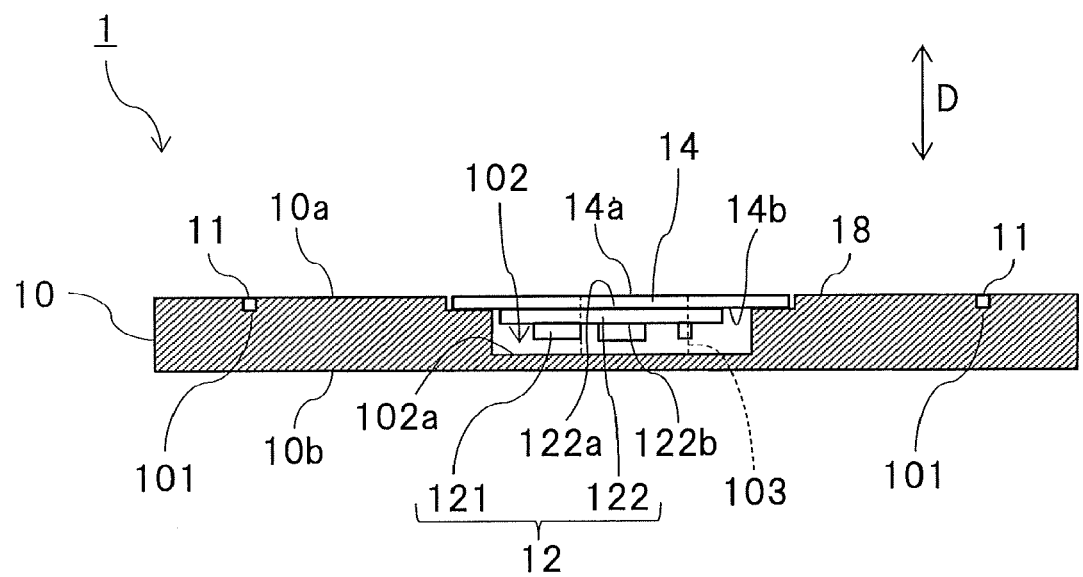
FIG. 2 is a cross-sectional view of the temperature measuring mask exemplifying the first embodiment.

First, as a first embodiment, an embodiment of a temperature measuring mask having a first photoelectric cell is described. FIG. 1 is a plan view of a temperature measuring mask 1 exemplifying the first embodiment. FIG. 2 is a cross-sectional view of the temperature measuring mask 1 exemplifying the first embodiment, that is, a cross-sectional view taken along II-II in FIG. 1.

As illustrated in FIG. 1, the temperature measuring mask 1 includes a substrate 10, a plurality of temperature sensors 11, a circuit board 12, a secondary cell 13, and a first solar cell 14 which is an example of a photoelectric cell.

The substrate 10 has a predetermined thickness and has a rectangular shape in plain view. The substrate 10 has, in an upper surface 10a thereof which is orthogonal to a thickness direction D, a plurality of first recessed portions 101 in which the corresponding temperature sensors 11 are disposed. The substrate 10 further has, in the upper surface 10a, a second recessed portion 102 in which the circuit board 12 and the solar cell 14 are disposed. As illustrated in FIG. 2, the substrate 10 further has, along the thickness direction D, a through hole 103 in which the secondary cell 13 is disposed. The material of the substrate 10 is same as the material of a transparent substrate forming a mask blank, and is preferably a quarts glass, for example.

The temperature sensors 11 are provided to the substrate 10. More specifically, as illustrated in FIG. 2, the temperature sensors 11 are disposed in the corresponding first recessed portions 101. The temperature sensors 11 sense temperatures of the inside of an electron beam lithography device, which is described later, on the basis of change in physical quantity (for example, a resistance or electromotive force) according to the temperature of the inside of the electron beam lithography device. More specifically, the temperature sensors 11 sense temperatures of the upper surface 10a of the substrate 10 corresponding to a position at which lithography is performed on a mask blank. In order to sense temperatures of the upper surface 10a accurately, upper end surfaces, that is, sensor surfaces of the temperature sensors 11 are exposed so as to be substantially flush with the upper surface 10a. Further, in order to uniformly sense temperatures over the upper surface 10a, the temperature sensors 11 are disposed at a plurality of positions in the upper surface 10a in a dispersed manner.

The specific form of the temperature sensors 11 is not limited to a particular form. The temperature sensors 11 may be thermocouples etc., for example. According to the temperature sensors 11, temperatures of the upper surface 10a having the same temperature condition (for example, temperature distribution, or temperature variation) as the surface of a mask blank on which lithography is actually performed can be sensed. Thus, physical quantity change of the temperature sensors 11 can be effectively used for temperature adjustment in chambers, which are described later.

The circuit board 12, that is, a printed board is disposed in the second recessed portion 102 so as to have a space relative to inner surfaces 102a (that is, a bottom surface and lateral surfaces) of the second recessed portion 102, as illustrated in FIG. 2. That is, the circuit board 12 is provided to the substrate 10. The circuit board 12 includes a substrate 122, and a circuit 121 arranged on a lower surface 122b of the substrate 122.

Figure 3:
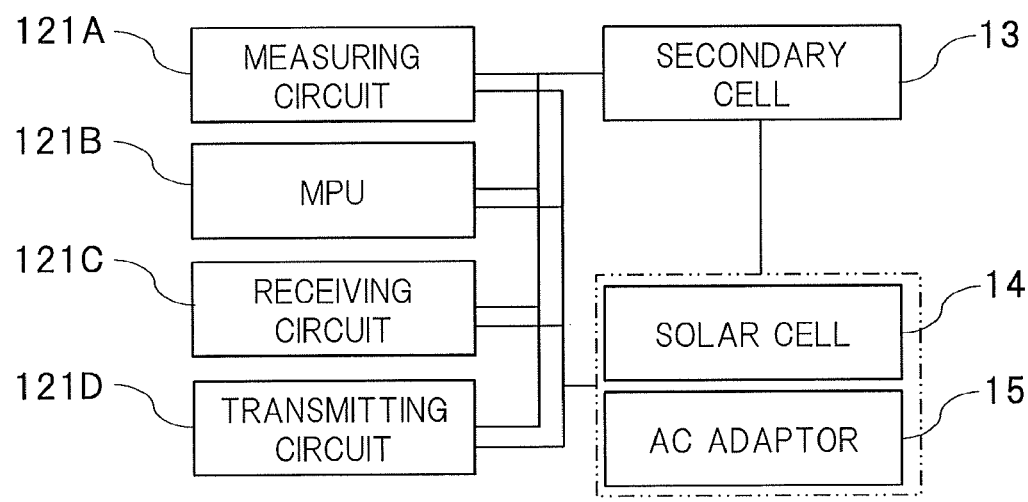
FIG. 3 is a block diagram of the temperature measuring mask exemplifying the first embodiment.

FIG. 3 is a block diagram of the temperature measuring mask 1 exemplifying the first embodiment. As illustrated in FIG. 3, the circuit 121 includes a measuring circuit 121A, an MPU (micro processing unit) 121B, a receiving circuit 121C, and a transmitting circuit 121D.

The measuring circuit 121A is electrically connected to the temperature sensors 11 via wiring patterns 106 illustrated in FIG. 1. The measuring circuit 121A measures a temperature of the inside of the electron beam lithography device by using the temperature sensors 11. More specifically, the measuring circuit 121A measures a temperature by converting physical quantity change of the temperature sensor 11 into an appropriate voltage.

The MPU 121B stores a temperature measured by the measuring circuit 121A as temperature measurement data (hereinafter, also referred to as "temperature data"). More specifically, the MPU 121B converts a voltage converted by the measuring circuit 121A into digital data, that is, temperature data by means of a built-in A/D converter. Further, the MPU 121B stores the digital data in a built-in memory which is an example of a storage device. The built-in memory of the MPU 121B is a volatile memory, for example.

Outside the electron beam lithography device, the receiving circuit 121C receives a temperature-data transmission command from an external PC (personal computer) (not illustrated).

Outside the electron beam lithography device, the transmitting circuit 121D transmits, to the external PC, the temperature data read from the built-in memory of the MPU 121B in accordance with the temperature-data transmission command.

The circuit 121 including the measuring circuit 121A, the MPU 121B, the receiving circuit 121C, and the transmitting circuit 121D operates using electric power charged in the secondary cell 13, electric power generated by the solar cell 14, or electric power inputted from an AC adaptor 15. The solar cell 14 and the AC adaptor 15 may be connectable selectively to the secondary cell 13 and the circuit 121 by means of a switching element (not illustrated).

As illustrated in FIG. 1, the secondary cell 13 is disposed in the through hole 103 (see FIG. 2) in a state of being housed in a battery case 131. As illustrated in FIG. 1, the secondary cell 13 is electrically connected to the circuit 121 and the solar cell 14 via a wiring pattern 107. The secondary cell 13 supplies electric power to the circuit 121. The secondary cell 13 is a coin-shaped lithium ion secondary cell, for example. The secondary cell 13 which can be recharged repeatedly has a smaller frequency of battery exchange than a primary cell.

As illustrated in FIG. 2, the solar cell 14 is disposed in the second recessed portion 102. As a result of being irradiated with an energy beam, the solar cell 14 generates electric power. For example, as a result of being irradiated with light, laser, an electron beam, etc. from a light source such as an illumination (described later) inside or outside the electron beam lithography device, the solar cell 14 generates electric power. The solar cell 14 charges the secondary cell 13 by generating electric power. In order to receive light from the light source, the upper surface 14a of the solar cell 14, that is, a light receiving surface is exposed so as to be almost flush with the upper surface 10a of the substrate 10. The solar cell 14 is a pn junction solar cell, for example.

Further, the solar cell 14 is bonded to the circuit board 12 so as to overlap with the circuit board 12 in the thickness direction D of the substrate 10. More specifically, as illustrated in FIG. 2, a lower surface 14b of the solar cell 14 is attached to the upper surface 122a of the substrate 122. The attachment may be adhesion using an adhesive, for example. The solar cell 14 may be detachably attached to the substrate 10 by a fixing method such as screwing.

According to the temperature measuring mask 1 of the first embodiment having the above configuration, as a result of using the secondary cell 13 which has a smaller frequency of battery exchange than a primary cell, occurrence of particles and measurement errors caused in battery exchange can be reduced.

If the secondary cell 13 is charged inside a lithography chamber (which is described later) by electromagnetic induction, a charging coil needs to be added to the inside of the lithography chamber. However, in the temperature measuring mask 1 of the first embodiment, the secondary cell 13 can be charged by the solar cell 14, and thus, charging using an existing light source inside the chamber (which is described later) is allowed so that cost reduction can be achieved.

(Temperature Measuring Method)

Figure 4:
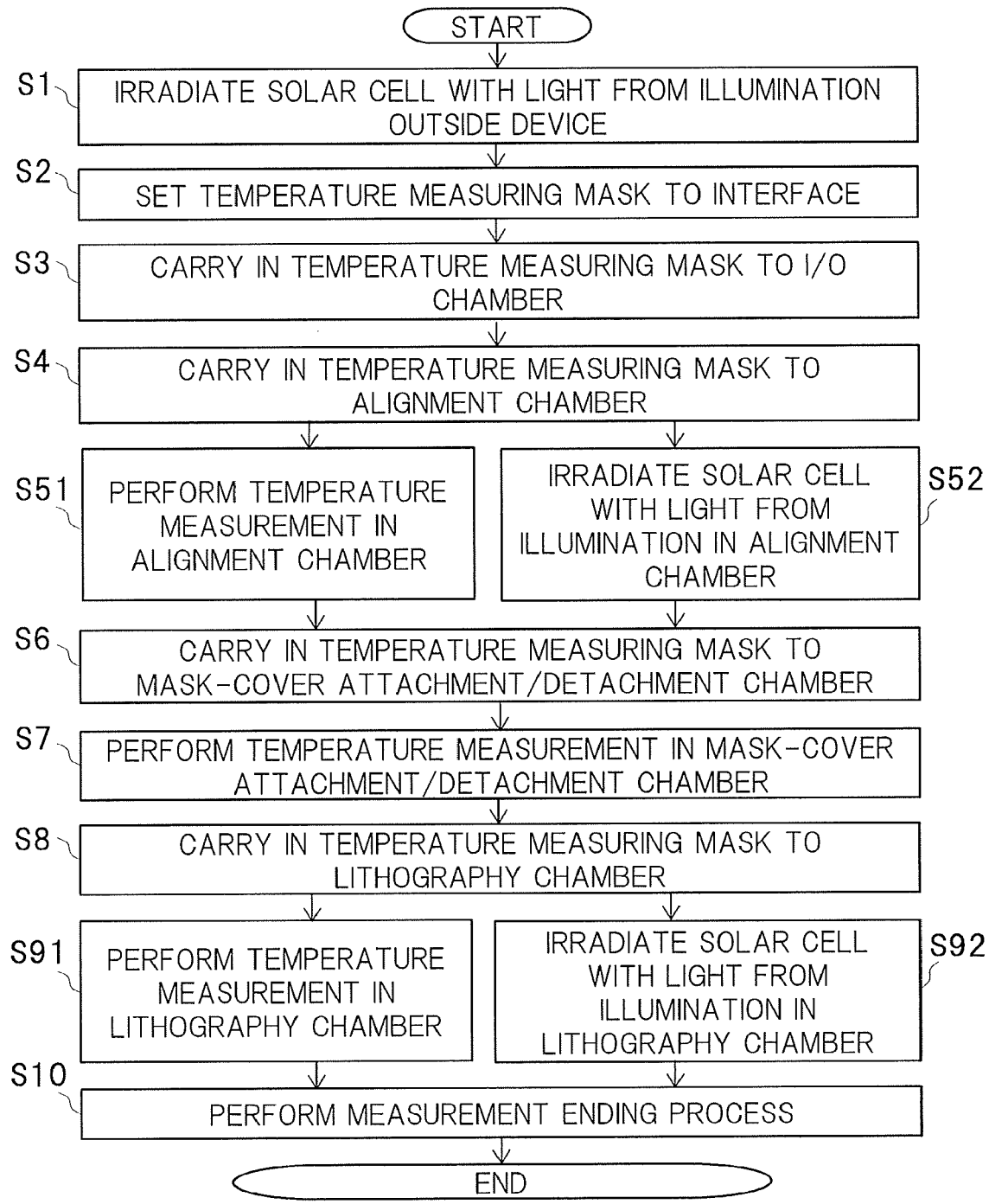
FIG. 4 is a flowchart of a temperature measuring method exemplifying the first embodiment.

Next, a description is given of a temperature measuring method in which the temperature measuring mask 1 in FIG. 1 is applied. FIG. 4 is a flowchart of the temperature measuring method exemplifying the first embodiment.

Here, prior to the description of the temperature measuring method, a configuration used for the temperature measuring method is described.

Figure 5:
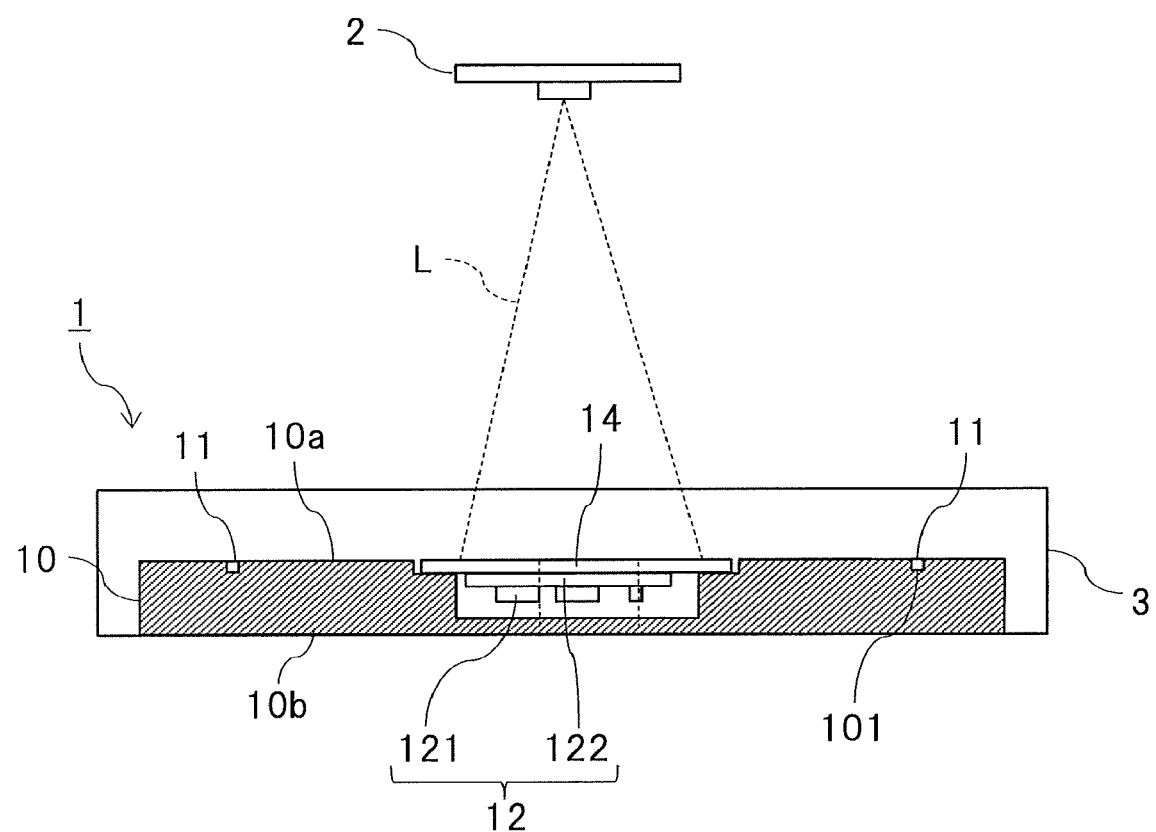
FIG. 5 is a schematic view of an illumination outside an electron beam lithography device used for the temperature measuring method exemplifying the first embodiment.
Figure 6:
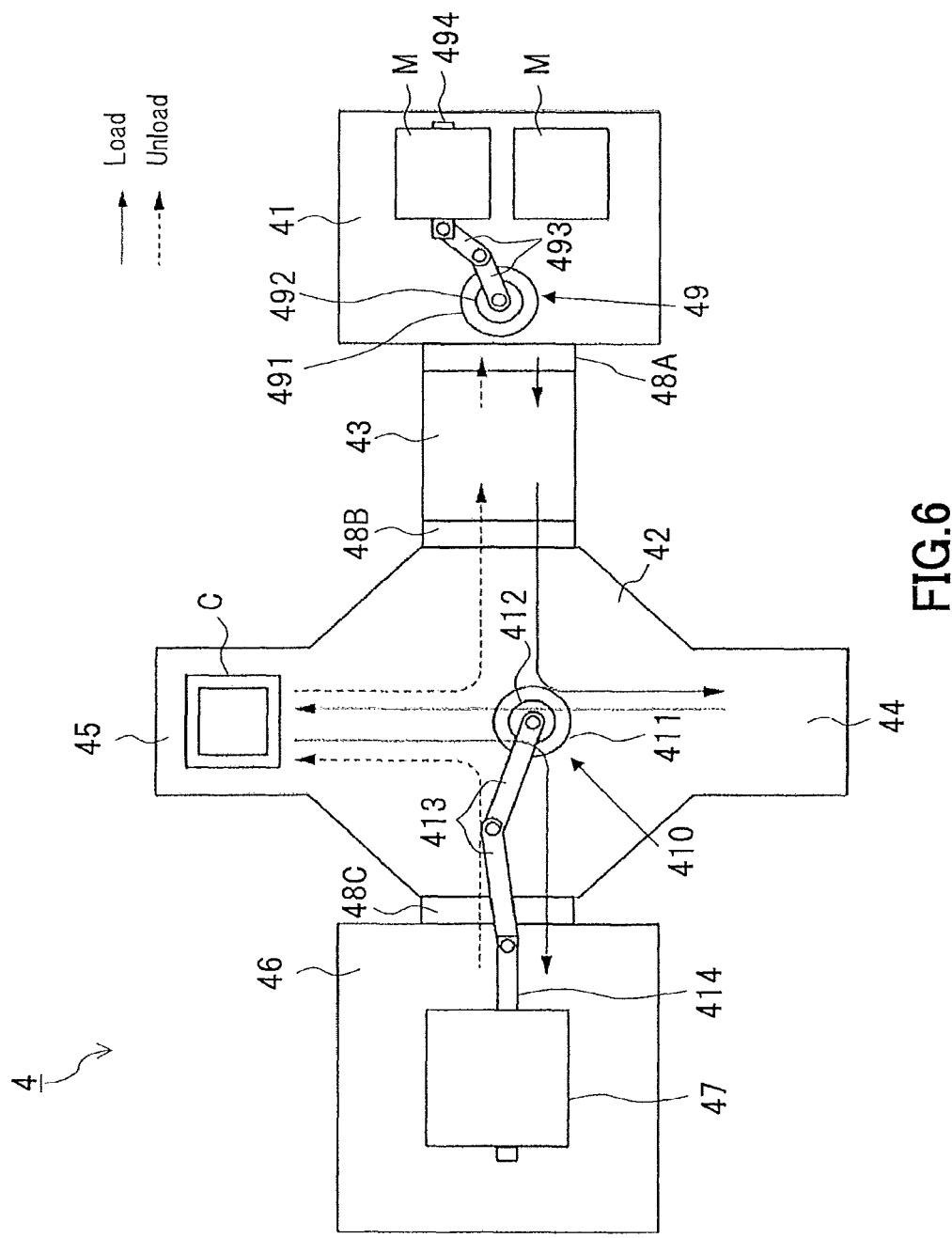
FIG. 6 is a plan view of the electron beam lithography device used for the temperature measuring method exemplifying the first embodiment.

FIG. 5 is a schematic view of an illumination 2 outside the electron beam lithography device used for the temperature measuring method exemplifying the first embodiment. The electron beam lithography device is an example of the charged particle beam lithography device. The illumination 2 is an example of the light source. FIG. 6 is a plan view of an electron beam lithography device 4 used for the temperature measuring method exemplifying the first embodiment.

Figure 7:
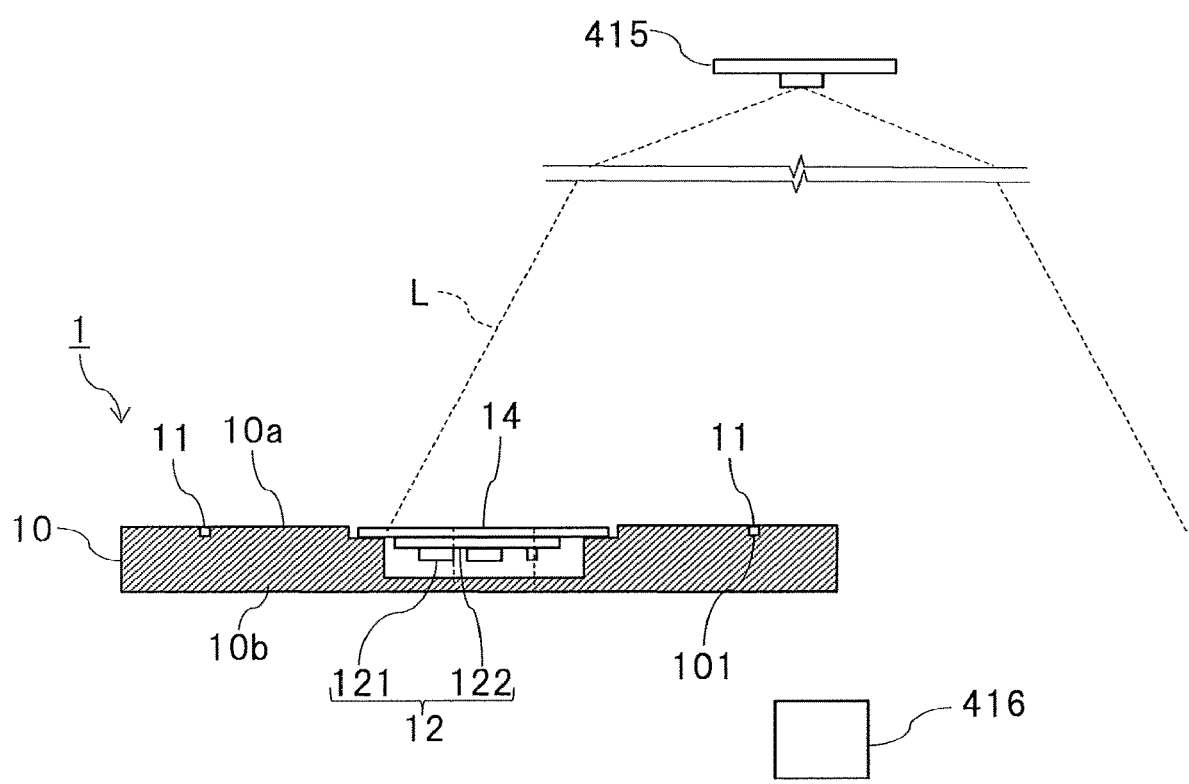
FIG. 7 is a schematic view of an illumination inside the electron beam lithography device used for the temperature measuring method exemplifying the first embodiment.

The solid-line arrows in FIG. 6 represent routes along which a mask blank M is loaded to be subjected to actual lithography, and the broken-line arrows in FIG. 6 represent routes along which the mask blank M is unloaded after the lithography. FIG. 7 is a schematic view of an illumination 415 inside the electron beam lithography device 4 used for the temperature measuring method exemplifying the first embodiment.

The illumination 2 in FIG. 5 is an LED, for example. The illumination 2 may be an illumination for a clean room.

As illustrated in FIG. 6, the electron beam lithography device 4 includes an interface 41, a vacuum unit 42, an I/O chamber 43, an alignment chamber 44, a mask-cover attachment/detachment chamber 45 (that is, covering chamber), and a lithography chamber 46. In the interface 41, the mask blank M is placed under the atmosphere. The inside of the vacuum unit 42 is held to vacuum pressure. The alignment chamber 44 performs alignment of correcting positional deviation or rotational deviation of the mask blank M. Further, the alignment chamber 44 adjusts the temperature of the mask blank M to a predetermined temperature by using constant temperature water, etc. so as to keep the temperature constant. The mask-cover attachment/detachment chamber 45 attaches/detaches, to/from the mask blank M, a conductive mask cover C which eliminates static electricity on the mask blank M, that is, causes the mask blank M to be grounded. The lithography chamber 46 performs lithography on the mask blank M.

Above the lithography chamber 46, a mirror tower 47 including an electron gun, various apertures, a deflector, and a lens is provided. Between the interface 41 and the I/O chamber 43, a gate valve 48A which permits or inhibits communication between the interface 41 and the I/O chamber 43 through an opening/closing operation is provided. Between the I/O chamber 43 and the vacuum unit 42, a gate valve 48B which permits or inhibits communication between the I/O chamber 43 and the vacuum unit 42 through an opening/closing operation is provided. Between the vacuum unit 42 and the lithography chamber 46, a gate valve 48C which permits or inhibits communication between the vacuum unit 42 and the lithography chamber 46 through an opening/closing operation is provided.

The interface 41 has an atmospheric carrying robot 49. The carrying robot 49 has a robot body 491, an elevating rod 492, a robot arm 493, and an end effector 494. The vacuum unit 42 includes a vacuum carrying robot 410. The carrying robot 410 has a robot body 411, an elevating rod 412, a robot arm 413, and an end effector 414.

As illustrated in FIG. 7, in the alignment chamber 44, an illumination 415 and a camera 416 which are used for measuring a position of the mask blank M in performing alignment are provided. Also in the lithography chamber 46, the illumination 415 and the camera 416 which are used for measuring a position of the mask blank M in performing lithography are provided. The illumination 415 is an LED, for example. The camera 416 is a digital camera including a solid state imaging element, for example. The illumination 415 irradiates an edge of the mask blank M with light from above. The camera 416 detects an image of the edge of the mask blank M by receiving the light below the mask blank M. As illustrated in FIG. 7, in the temperature measuring method of the first embodiment, light L from the illumination 415 is used for the solar cell 14 to generate electric power, that is, to charge the secondary cell 13.

Next, the temperature measuring method using the above configuration is described.

As illustrated in FIG. 4, first, the illumination 2 (see FIG. 5) outside the electron beam lithography device irradiates the solar cell 14 of the temperature measuring mask 1 with strong light (step S1). Irradiation with light from the illumination 2 causes the solar cell 14 to generate electric power to charge the secondary cell 13. At that time, as illustrated in FIG. 5, the solar cell 14 is irradiated with the light L from the illumination 2 in a state where the temperature measuring mask 1 is housed in a transparent case 3. Since the temperature measuring mask 1 is housed in the transparent case 3, attachment of particles to the temperature measuring mask 1 is avoided. As a result of using an LED as the illumination 2, a sufficient amount of the light L for electric power generation can be supplied to the solar cell 14.

Next, in order to measure a temperature of the inside of the electron beam lithography device 4, the temperature measuring mask 1 is set in the interface 41 (step S2).

Next, after the gate valve 48A is opened, the atmospheric carrying robot 49 carries in the temperature measuring mask 1 to the I/O chamber 43 (step S3). Subsequently, the gate valve 48A is closed. An exhaust device (not illustrated) may exhaust the I/O chamber 43 such that the I/O chamber 43 becomes vacuum.

Next, after the gate valve 48B is opened, the vacuum carrying robot 410 carries in the temperature measuring mask 1 to the alignment chamber 44 through the vacuum unit 22 (step S4). In this carry-in step, the gate valve 48B is closed.

Next, the measuring circuit 121A of the temperature measuring mask 1 performs temperature measurement in the alignment chamber 44 on the basis of physical quantity change of the temperature sensors 11 (step S51). The MPU 121B performs A/D conversion of the measurement result obtained from the measuring circuit 121A, and stores the temperature data obtained through the A/D conversion in the built-in memory. At that time, the illumination 415 (see FIG. 7) in the alignment chamber 44 irradiates the solar cell 14 of the temperature measuring mask 1 with light (step S52). Irradiation with the light from the illumination 415 causes the solar cell 14 to generate electric power to charge the secondary cell 13. Making the temperature of the temperature measuring mask 1 constant or performing alignment on the temperature measuring mask 1 may be done in the alignment chamber 44.

Next, the vacuum carrying robot 410 carries in the temperature measuring mask 1 to the mask-cover attachment/detachment chamber 45 (step S6).

Next, the measuring circuit 121A performs temperature measurement in the mask-cover attachment/detachment chamber 45 by using the temperature sensors 11 (step S7), and the MPU 121B stores in the built-in memory the temperature data according to the measurement result. At that time, the mask cover C may be attached to the temperature measuring mask 1.

Next, after the gate valve 48C is opened, the vacuum carrying robot 410 carries in the temperature measuring mask 1 to the lithography chamber 46 (step S8). Subsequently, the gate valve 48C is closed.

Next, the measuring circuit 121A performs temperature measurement in the lithography chamber 46 by using the temperature sensors 11 (step S91), and the MPU 121B stores in the built-in memory the temperature data according to the measurement result. At that time, the illumination 415 in the lithography chamber 46 irradiates the solar cell 14 with light (step S92). Irradiation with the light from the illumination 415 causes the solar cell 14 to generate electric power to charge the secondary cell 13. Subsequently, the temperature measuring mask 1 is returned from the lithography chamber 46 to the interface 41 through the I/O chamber 43, and then, is taken out from the electron beam lithography device 4.

Next, the temperature measuring mask 1 performs a measurement ending process (step S10). In the measurement ending process, the receiving circuit 121C receives a temperature-data request signal from an external PC. The transmitting circuit 121D transmits, to the external PC, temperature data read from the built-in memory of the MPU 121B in response to the temperature-data request signal. The external PC stores the temperature data transmitted from the transmitting circuit 121D in an external memory (not illustrated). The external memory is a non-volatile memory, for example.

Next, temperature adjustment is performed on the chambers 44, 45, and 46 on the basis of the temperature data read from the temperature measuring mask 1. The temperature adjustment may be performed by a temperature adjustment device (not illustrated) using constant temperature water connected to the external PC.

Figure 8:
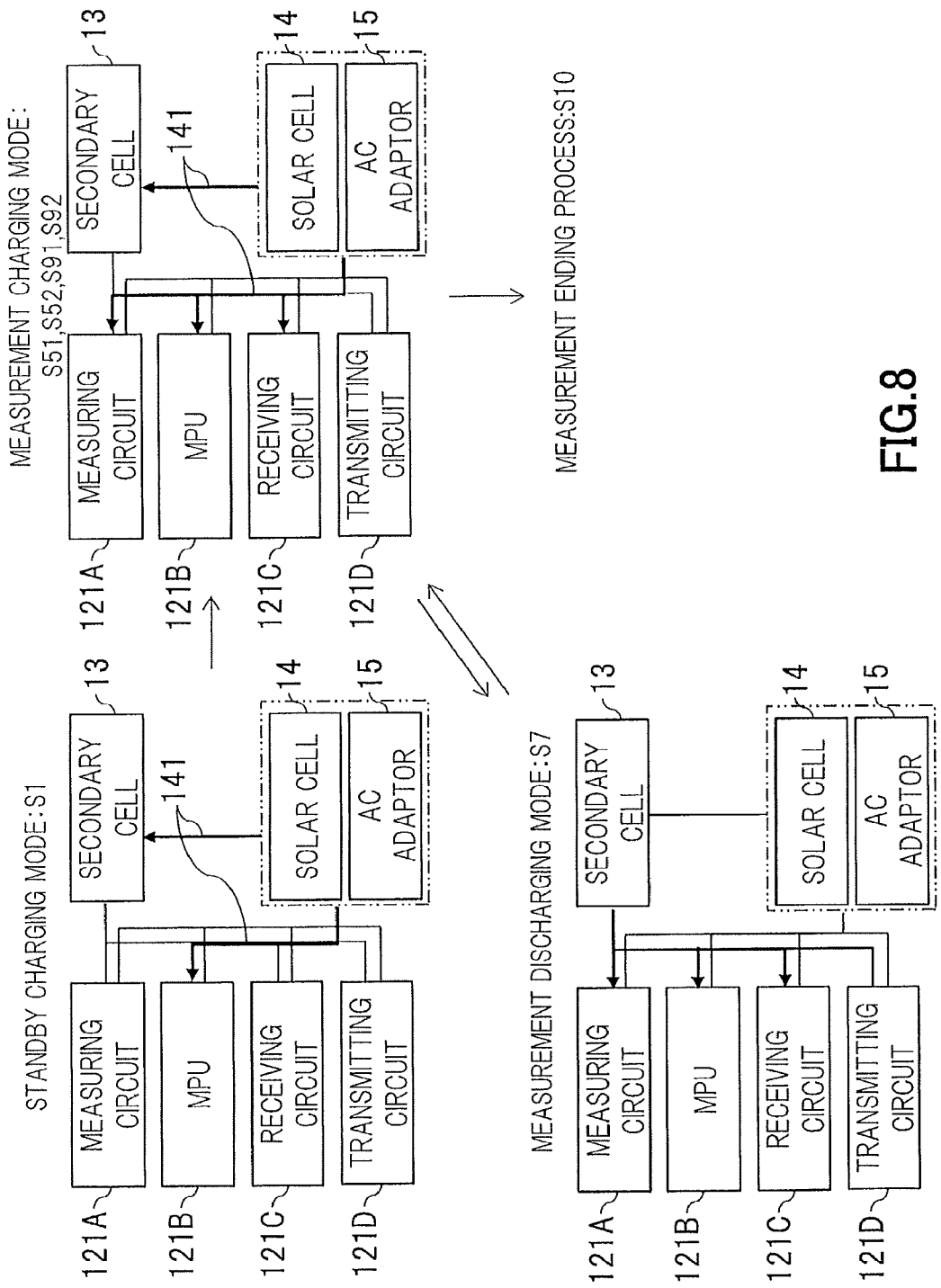
FIG. 8 is a diagram of state transition of the temperature measuring mask in the temperature measuring method exemplifying the first embodiment.

Next, a description is given of state transition of the temperature measuring mask 1 in the temperature measuring method shown in FIG. 4. FIG. 8 is a diagram of state transition of the temperature measuring mask 1 in the temperature measuring method exemplifying the first embodiment.

When the solar cell 14 is irradiated with light from the illumination 2 outside the electron beam lithography device (step S1 in FIG. 4), the temperature measuring mask 1 enters a standby charging mode, as illustrated in FIG. 8. In the standby charging mode, the solar cell 14 supplies electric power 141 to the secondary cell 13 and the MPU 121B.

The temperature measuring mask 1 may enter the standby charging mode at a time other than step S1 in FIG. 4. For example, the temperature measuring mask 1 in a standby discharging mode (not illustrated) in which electric power in the secondary cell 13 is supplied from the secondary cell 13 to the MPU 121B and the receiving circuit 121C without temperature measurement being performed may enter the standby charging mode when the charge voltage of the solar cell 14 exceeds 5V. Under a state where irradiation of the solar cell 14 with an energy beam is possible, this transition from the standby discharging mode to the standby charging mode is conducted.

When the temperature measurement in the alignment chamber 44 (step S51 in FIG. 4) and irradiation of the solar cell 14 with light from the illumination 415 in the alignment chamber 44 (step S52 in FIG. 4) are performed, the temperature measuring mask 1 enters a measurement charging mode, as illustrated in FIG. 8. In the measurement charging mode, the solar cell 14 supplies the electric power 141 to the secondary cell 13, the measuring circuit 121A, the MPU 121B, and the receiving circuit 121C.

When temperature measurement is performed in the mask-cover attachment/detachment chamber 45 (step S7 in FIG. 4), the temperature measuring mask 1 enters a measurement discharging mode, as illustrated in FIG. 8. In the measurement discharging mode, the secondary cell 13 supplies electric power 131 to the measuring circuit 121A, the MPU 121B, and the receiving circuit 121C.

The temperature measuring mask 1 may enter the measurement discharging mode at a time other than step S7 in FIG. 4. For example, the temperature measuring mask 1 in the measurement charging mode may enter the measurement discharging mode when charging of the secondary cell 13 is completed or when the charge voltage of the solar cell 14 becomes below 5V. The temperature measuring mask 1 in the standby discharging mode may enter the measurement charging mode when the receiving circuit 121C receives, from an external PC, a temperature measurement command for temperature measurement.

When temperature measurement in the lithography chamber 46 (S91 in FIG. 4) and irradiation of the solar cell 14 with light from the illumination 415 in the lithography chamber 46 (S92 in FIG. 4) are performed, the temperature measuring mask 1 enters the measurement charging mode, as illustrated in FIG. 8.

The temperature measuring mask 1 may enter the measurement charging mode at a time other than steps S51, S52, S91, or S92 in FIG. 4. For example, the temperature measuring mask 1 in the measurement discharging mode may enter the measurement charging mode when the charge voltage of the solar cell 14 exceeds 5V or charging becomes possible.

After temperature measurement in the lithography chamber 46 (step S91 in FIG. 4) and irradiation of the solar cell 14 with light (step S92 in FIG. 4) are performed, the temperature measuring mask 1 proceeds to the measurement ending process (step S10) which is performed outside the electron beam lithography device 4. As described above, the measurement ending process may be performed using, as a trigger, reception of a temperature-data transmission command, or using, as a trigger, voltage decrease in the secondary cell 13.

According to the temperature measuring method of the first embodiment, while occurrence of particles and measurement errors is reduced, the solar cell 14 is caused to generate electric power in the chambers 44, 45, and 46 using the existing illumination 415 to charge the secondary cell 13. Since the illumination 2 outside the electron beam lithography device 4 irradiates the solar cell 14 with strong light, an amount of electric power generated by the solar cell 14 per unit area can be increased. Since generated power per unit is much, the area of the solar cell 14 can be reduced accordingly. As a result, thermal influence of the solar cell 14 on the temperature measuring mask 1 can be reduced. Thus, temperature data enabling accurate temperature adjustment can be obtained.

(First Modification)

Figure 9:
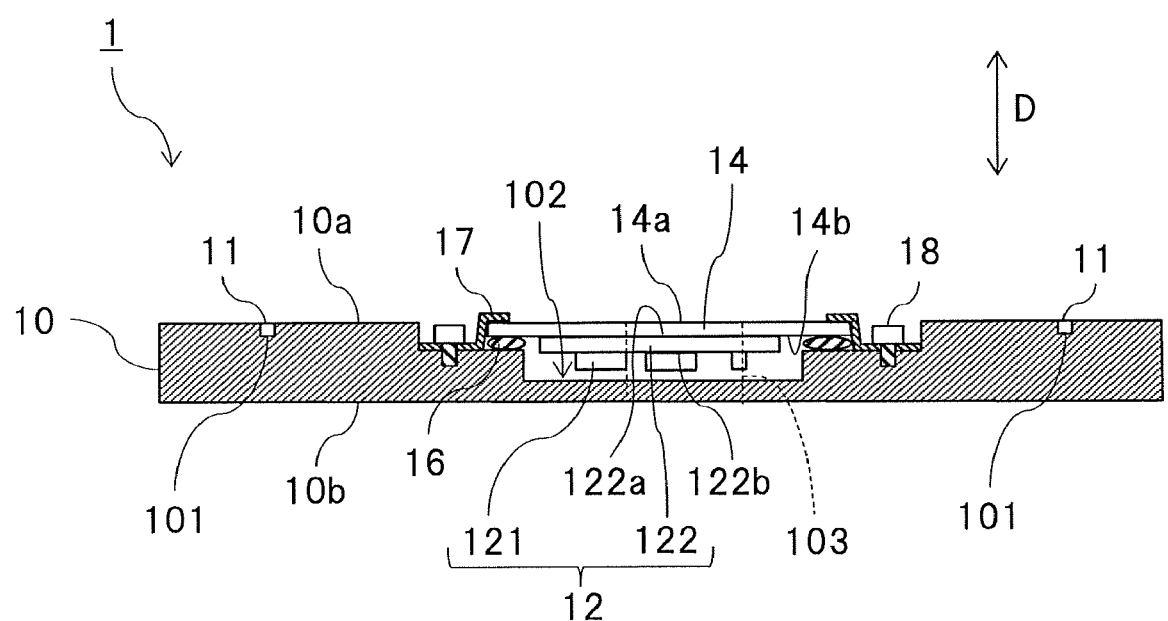
FIG. 9 is a cross-sectional view of a temperature measuring mask exemplifying a first modification of the first embodiment.

As a first modification of the first embodiment, a description is given of an example of the temperature measuring mask 1 in which the solar cell 14 is thermally separated from the substrate 10. In the description of the first modification, components corresponding to those in FIGS. 1 to 7 are denoted by the same reference numbers and the overlapping explanation thereof is omitted. FIG. 9 is a cross-sectional view of the temperature measuring mask 1 exemplifying the first modification of the first embodiment.

As illustrated in FIG. 9, in the first modification, the solar cell 14 is bonded to the circuit board 12 so as to overlap with the circuit board 12 in the thickness direction D of the substrate 10, and the solar cell 14 is thermally separated from the substrate 10. More specifically, as illustrated in FIG. 9, a heat insulating material 16 is disposed between the lower surface 14b of the solar cell 14 and the bottom surface of the second recessed portion 102. Each end edge of the upper surface 14a of the solar cell 14 is pressed by a pressing plate 17. The pressing plate 17 is fixed to the substrate 10 with a screw 18. The screw 18 is disposed in the second recessed portion 102 such that the screw 18 does not protrude from the upper surface 10a of the substrate 10.

In the temperature measuring mask 1 of the first modification, the circuit board 12 is bonded to the solar cell 14. Accordingly, heat of the circuit board 12 is transferred not to the substrate 10 side but to the solar cell 14 side. In addition, the solar cell 14 is thermally separated from the substrate 10. Accordingly, heat transferred from the circuit board 12 to the solar cell 14 is prevented from being transferred to the substrate 10. As a result, heat of the circuit board 12 is unlikely to have an influence on the substrate 10. Accordingly, temperature measurement can be performed by the measuring circuit 121A using the temperature sensors 11 under a temperature condition closer to that of the mask blank M. Therefore, temperature data enabling more accurate temperature adjustment can be obtained.

(Second Modification)

Figure 10:
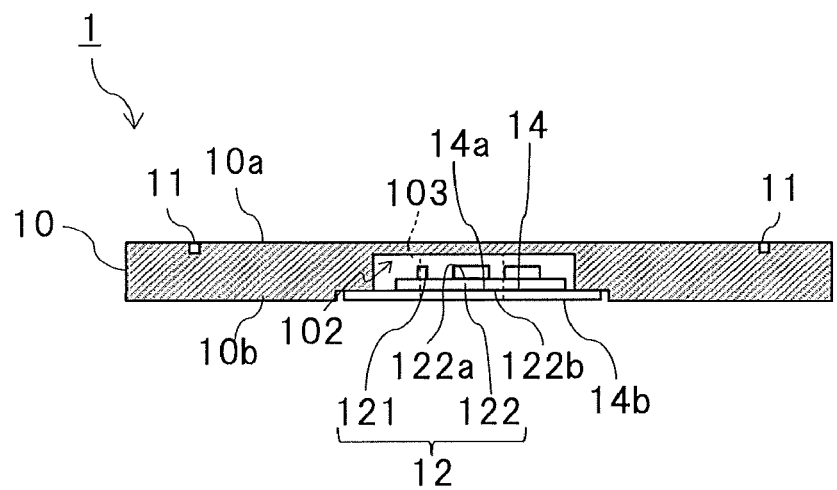
FIG. 10 is a cross-sectional view of a temperature measuring mask exemplifying a second modification of the first embodiment.

As a second modification of the first embodiment, a description is given of an example of the temperature measuring mask 1 in which the position of the solar cell 14 is vertically inverted with respect to the substrate 10. In the description of the second modification, components corresponding to those in FIGS. 1 to 7 are denoted by the same reference numbers and the overlapping explanation thereof is omitted. FIG. 10 is a cross-sectional view of the temperature measuring mask 1 exemplifying the second modification of the first embodiment.

As illustrated in FIG. 10, in the second modification, the solar cell 14 is disposed in the lower surface 10b of the substrate 10. In the second modification, the lower surface 14b of the solar cell 14 serves as a light receiving surface. The circuit board 12 is bonded to the upper surface 14a of the solar cell 14.

According to the temperature measuring mask 1 of the second modification, the solar cell 14 is disposed in the lower surface 10b opposite to the upper surface 10a in which the temperature sensors 11 are disposed. Accordingly, the measurement environment for the temperature sensors 11 can be made close to that of to a mask substrate. Therefore, according to the temperature measuring mask 1 of the second modification, temperature data enabling more accurate temperature adjustment can be obtained.

(Third Modification)

Figure 11:
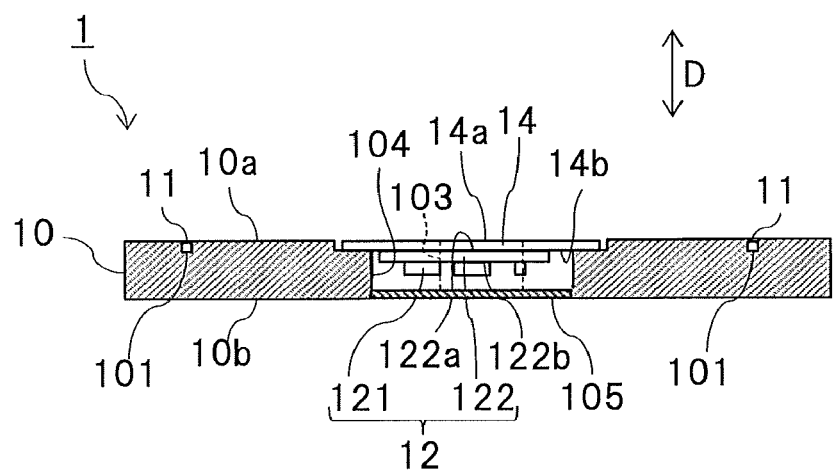
FIG. 11 is a cross-sectional view of a temperature measuring mask exemplifying a third modification of the first embodiment.

As a third modification of the first embodiment, a description is given of an example of the temperature measuring mask 1 in which the solar cell 14 is disposed in a through hole. In the description of the third modification, components corresponding to those in FIGS. 1 to 7 are denoted by the same reference numbers and the overlapping explanation thereof is omitted. FIG. 11 is a cross-sectional view of the temperature measuring mask 1 exemplifying the third modification of the first embodiment.

As illustrated in FIG. 11, the substrate 10 of the third modification has, instead of the second recessed portion 102 in FIG. 1, a through hole 104 that penetrates through the substrate 10 in the thickness direction D. The solar cell 14 and the circuit board 12 are disposed in the through hole 104. A reinforcing plate 105 is disposed at the lower end of the through hole 104 to cover an opening of the through hole 104. The reinforcing plate 105 is a metal plate, for example. The reinforcing plate 105 may be fixed to the substrate 10 by a fixing method such as screwing.

According to the temperature measuring mask 1 of the third modification, even when the circuit board 12 has a large thickness, the circuit board 12 can be disposed in the temperature measuring mask 1 without difficulty. In addition, the mechanical strength of the substrate 10 can be reinforced by means of the reinforcing plate 105.

(Fourth Modification)

Figure 12:
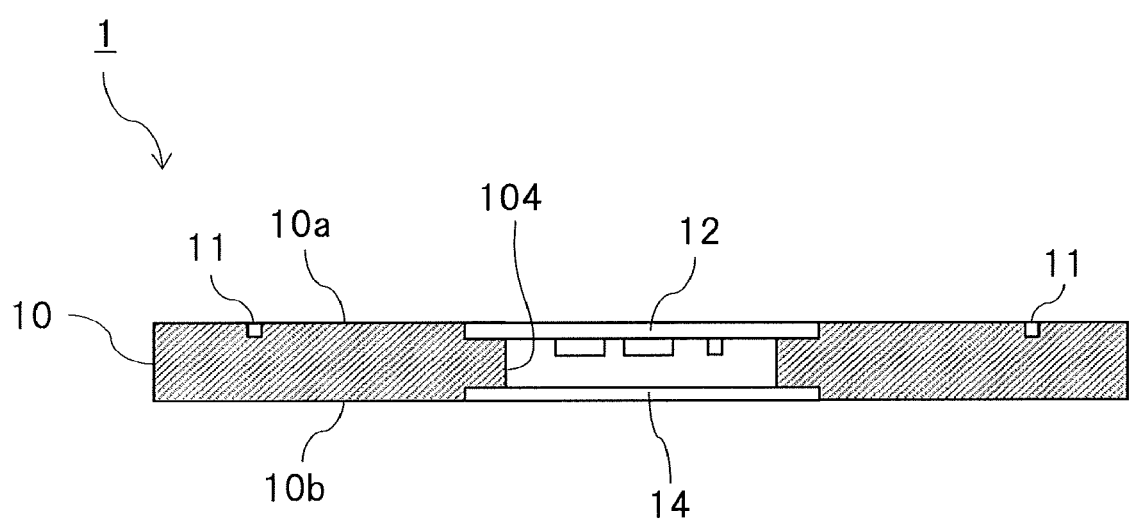
FIG. 12 is a cross-sectional view of a temperature measuring mask exemplifying a fourth modification of the first embodiment.

As a fourth modification of the first embodiment, a description is given of an example of the temperature measuring mask 1 in which the solar cell 14 is not bonded to the circuit board 12. In the description of the fourth modification, components corresponding to those in FIGS. 1 to 7 are denoted by the same reference numbers and the overlapping explanation thereof is omitted. FIG. 12 is a cross-sectional view of the temperature measuring mask 1 exemplifying the fourth modification of the first embodiment.

As illustrated in FIG. 12, in the fourth modification, the substrate 10 has the through hole 104 as in the third modification. Further, in the fourth modification, the circuit board 12 is disposed in the through hole 104 at the upper end thereof. The solar cell 14 is disposed in the through hole 104 at the lower end thereof so as to be opposed to the circuit board 12. The circuit board 12 may be fixed to the substrate 10 by a fixation method such as screwing.

According to the temperature measuring mask 1 of the fourth modification, the both ends of the through hole 104 can be reinforced by means of the circuit board 12 and the solar cell 14. As a result, the thickness of the circuit board 12 can be made larger than that in the third modification in which the reinforcing plate 105 is provided. Therefore, a degree of freedom in design can be improved.

(Fifth Modification)

Figure 13:
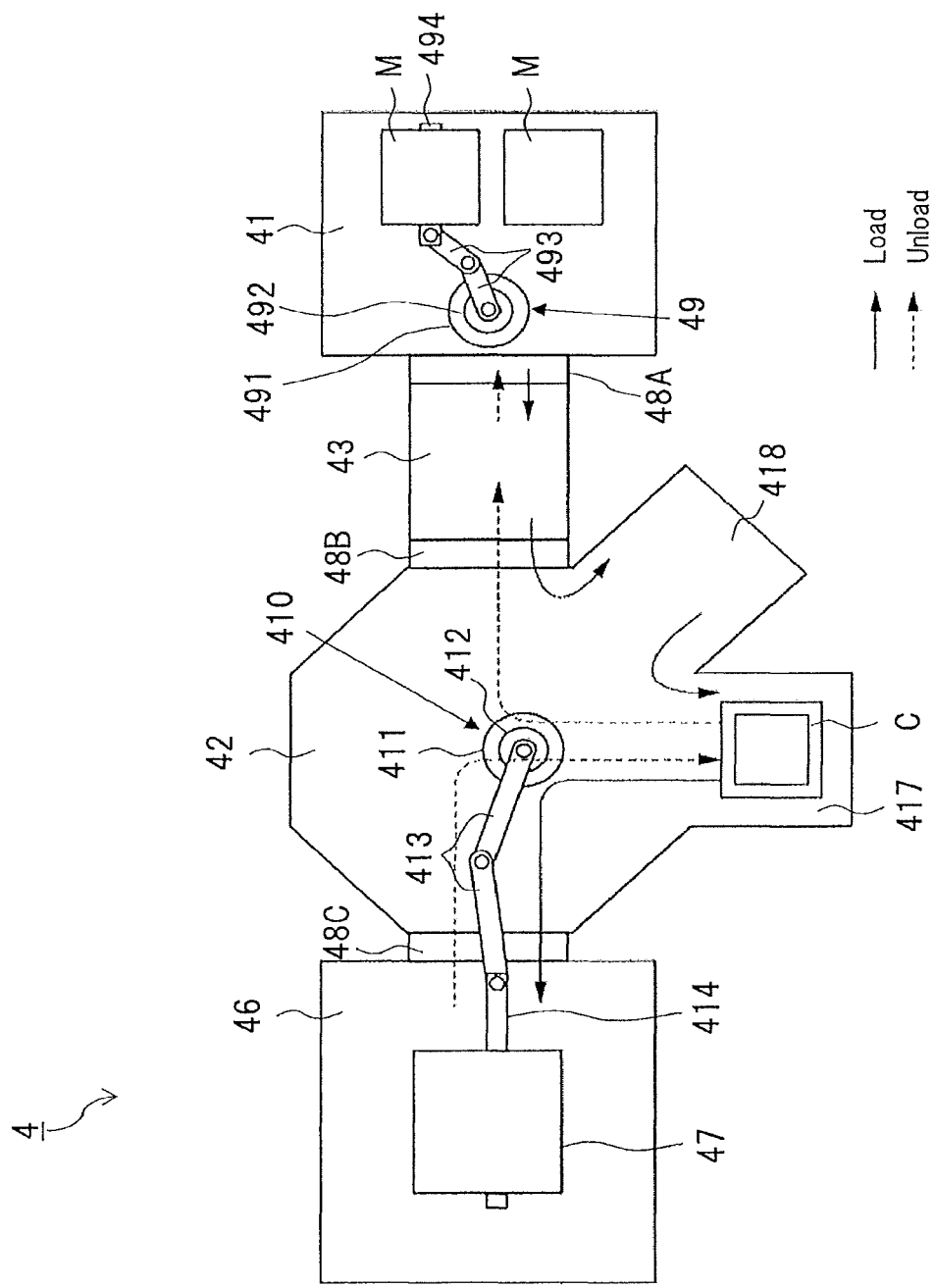
FIG. 13 is a plan view of an electron beam lithography device used for a temperature measuring method exemplifying a fifth modification of the first embodiment.

As a fifth modification of the first embodiment, a description is given of an example of a temperature measuring method using the electron beam lithography device 4 different from that in FIG. 6. In the description of the fifth modification, components corresponding to those in FIGS. 1 to 7 are denoted by the same reference numbers and the overlapping explanation thereof is omitted. FIG. 13 is a plan view of the electron beam lithography device 4 used for the temperature measurement method exemplifying the fifth modification of the first embodiment.

As illustrated in FIG. 13, the electron beam lithography device 4 of the fifth modification differs from the electron beam lithography device 4 in FIG. 6 in the configuration of the chambers. More specifically, the electron beam lithography device 4 of the fifth modification includes an alignment and cover-attachment/detachment chamber 417 having a function of integrating the functions of the alignment chamber 44 and the mask-cover attachment/detachment chamber 45 in FIG. 6, instead of the chambers 44 and 45. The electron beam lithography device 4 of the fifth modification further includes a thermostatic chamber 418 dedicated for making constant temperatures.

In temperature measurement in which the electron beam lithography device 4 of the fifth modification is applied, processes same as those (steps S4 to S7) performed in the alignment chamber 44 and the mask-cover attachment/detachment chamber 45 in FIG. 4 are performed in the alignment and cover-attachment/detachment chamber 417. More specifically, after the temperature measuring mask 1 is carried into the alignment and cover-attachment/detachment chamber 417, the measuring circuit 121A performs temperature measurement using the temperature sensors 11 and the secondary cell 13 is charged by irradiation of the solar cell 14 with light, in the alignment and cover-attachment/detachment chamber 417. Further, in the fifth modification, before being carried into the alignment and cover-attachment/detachment chamber 417, the temperature measuring mask 1 is carried into the thermostatic chamber 418. In the thermostatic chamber 418, temperature measurement is performed by the measuring circuit 121A.

According to the temperature measuring method of the fifth modification, temperatures can be measured while the secondary cell 13 is being charged in the electron beam lithography device 4, as in the configuration in FIGS. 1 to 7.

Second Embodiment

Figure 14:
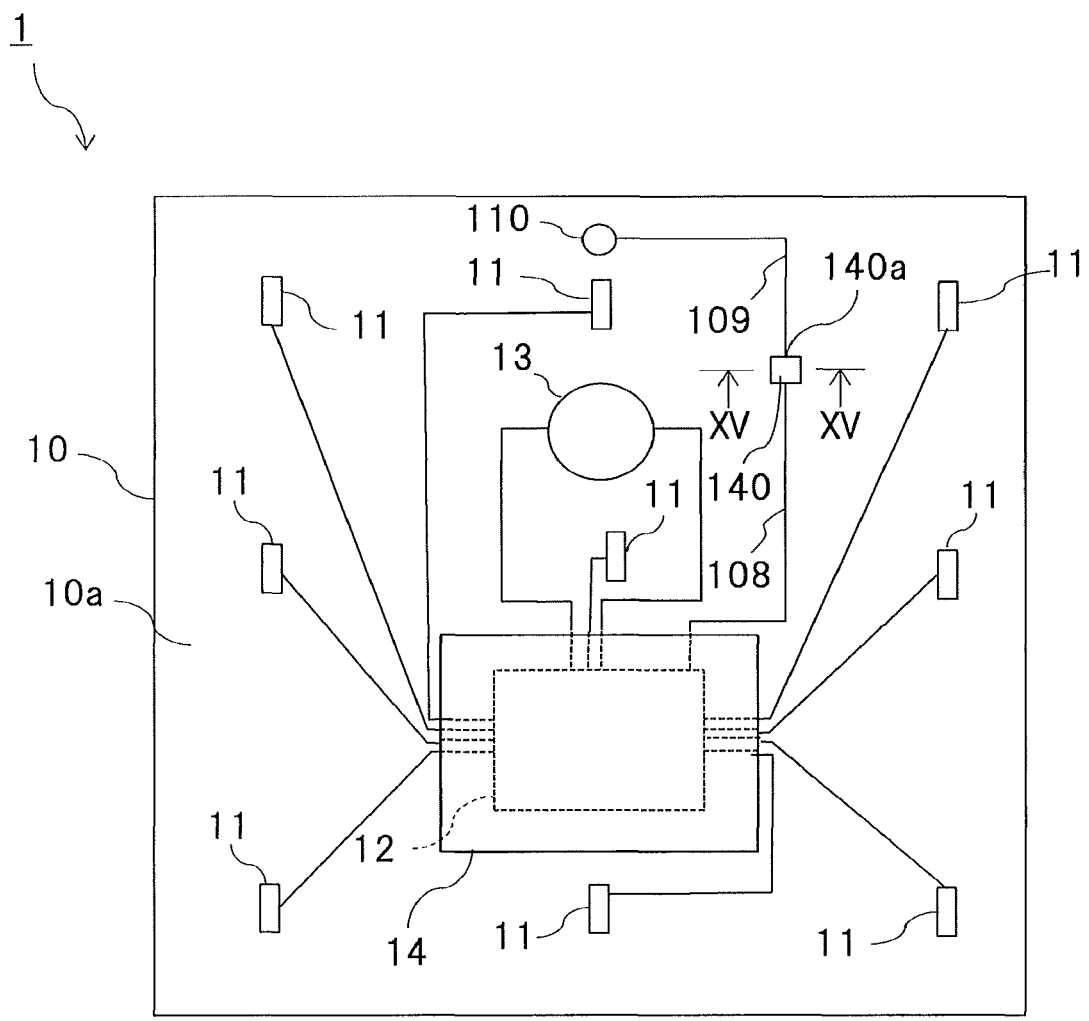
FIG. 14 is a plan view of a temperature measuring mask exemplifying a second embodiment.
Figure 15:
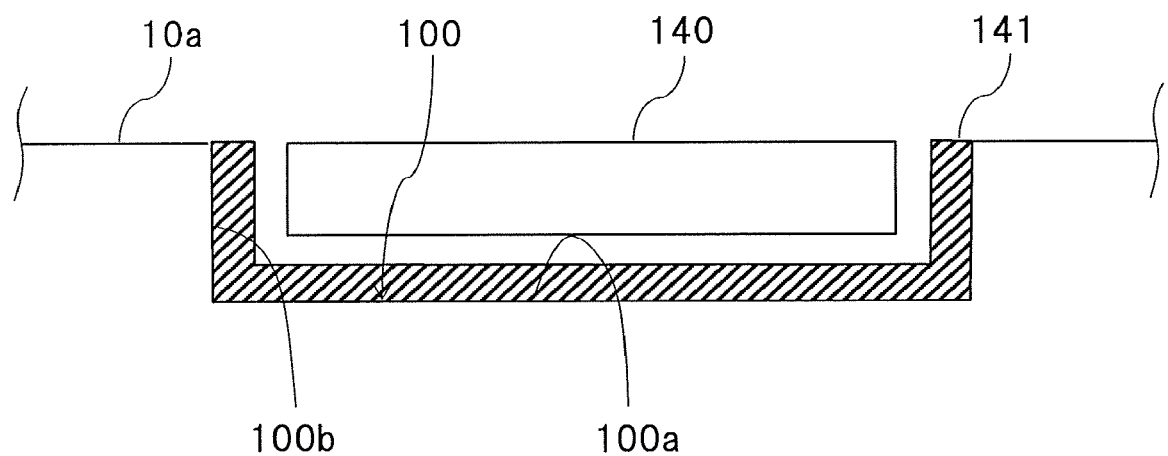
FIG. 15 is a cross-sectional view of the temperature measuring mask exemplifying the second embodiment.

As a second embodiment, a description is given of an embodiment of a temperature measuring mask including two photoelectric cells. In the description of the second embodiment, components corresponding to those in the first embodiment are denoted by the same reference numbers and the overlapping explanation thereof is omitted. FIG. 14 is a plan view of the temperature measuring mask 1 exemplifying the second embodiment. FIG. 15 is a cross-sectional view of the temperature measuring mask exemplifying the second embodiment, that is, a cross-sectional view taken along XV-XV in FIG. 14.

As illustrated in FIG. 14, the temperature measuring mask 1 of the second embodiment includes a second solar cell 140 which is an example of a photoelectric cell, in addition to the first solar cell 14. As illustrated in FIG. 15, the temperature measuring mask 1 of the second embodiment includes a shielding portion 141 that shields the second solar cell 140.

As illustrated in FIG. 15, the second solar cell 140 is disposed in a recessed portion 100 formed in the upper surface 10a so as to have a predetermined space relative to an inner surface 100a of the recessed portion 100.

The second solar cell 140 may be detachably attached to the substrate 10 by a fixing method such as screwing.

As illustrated in FIG. 14, the second solar cell 140 is electrically connected to the circuit 121 and the secondary cell 13 via a wiring pattern 108. The second solar cell 140 is irradiated with an electron beam (that is, an energy beam) from an EOS (electron optics system) of the electron beam lithography device 4, thereby generating electric power to charge the secondary cell 13.

In order to prevent heat generated in the second solar cell 140 as a result of irradiation with an electron beam from greatly influencing the temperature of the substrate 10, the area of the second solar cell 140 is made smaller than that of the first solar cell 14. In some cases, the area of the second solar cell 140 is large enough to receive at least a single electron beam.

As illustrated in FIG. 14, a ground 140a of the second solar cell 140 is, via a wiring pattern 109, electrically connected to a contact 110 relative to the mask cover C.

As illustrated in FIG. 15, the shielding portion 141 covers the inner surface of the recessed portion 100, that is, a bottom surface 100a and lateral surfaces 100b. The shielding portion 141 may be a metal film.

In temperature measurement of the second embodiment, in addition to charging of the secondary cell 13 performed by the first solar cell 14, charging of the secondary cell 13 is also performed by the second solar cell 140. More specifically, when temperature measurement is performed in the lithography chamber 46, the second solar cell 140 is irradiated with an electron beam so that the second solar cell 140 generates electric power to charge the secondary cell 13.

In temperature measurement of the second embodiment, prior to temperature measurement in the lithography chamber 46, the mask cover C is attached to the temperature measuring mask 1 in the mask-cover attachment/detachment chamber 45.

Through the attachment of the mask cover C, the ground 140a of the second solar cell 140 (see FIG. 14) is connected to the ground of the mask cover C.

According to the second embodiment, as a result of using the first solar cell 14 and the second solar cell 140, occurrence of particles and measurement errors caused in battery exchange can be reduced. In addition, a strong electron beam enables efficient charging of the secondary cell 13.

However, charge up of the second solar cell 140 due to the strong electron beam can be suppressed because the shielding portion 141 shields the second solar cell 140 and the ground 140a of the second solar cell 140 is connected to the ground of the mask cover C. As a result of suppressing such charge up, temperature data enabling more accurate temperature adjustment can be obtained.

To reduce deterioration in the second solar cell 140 due to irradiation with an electron beam, the thickness of a p-layer of the second solar cell 140 may be increased. Further, the second solar cell 140 may be combined with any of the temperature measuring masks 1 of the modifications of the first embodiment, as appropriate.

To perform temperature adjustment in real time, the circuit 121 may include a transmitter that transmits temperature data to a receiver in the electron beam lithography device. In this case, a temperature adjustment device using constant temperature water connected to the receiver may perform temperature adjustment.

Some of embodiments of the present invention have been described. However, the above embodiments have been presented as examples, and are not intended to limit the scope of the invention. The embodiments can be realized as other various forms, and various omissions, replacements, and changes can be done without departing from the gist of the invention. Such embodiments or modifications are included in the scope and the gist of the claimed invention, and are included in the scope of equivalents of the claimed invention.

The invention claimed is:

1. A temperature measuring mask, comprising:
   a substrate;
   a temperature sensor being provided to the substrate on a first side thereof, and being configured to sense a temperature inside a charged particle beam lithography device;
   a circuit board being provided to the substrate, and comprising
      a measuring circuit configured to measure a temperature using the temperature sensor, and
      a storage device configured to store measurement data of the measured temperature;
   a secondary cell being provided to the substrate, and being configured to supply electric power to the circuit board; and
   a photoelectric cell being provided to the substrate, and being configured to generate electric power by being irradiated with an energy beam to charge the secondary cell,
   wherein the photoelectric cell is disposed in a recessed portion provided on a surface of the substrate on a second side thereof, which is opposite to another surface of the substrate on the first side to which the temperature sensor is provided.

2. The temperature measuring mask according to claim 1, wherein the photoelectric cell is bonded to the circuit board so as to overlap with the circuit board in a thickness direction of the substrate, and is thermally separated from the substrate.

3. The temperature measuring mask according to claim 2, wherein
   a recessed portion in which the circuit board and the photoelectric cell are disposed is provided in an upper surface of the substrate that is orthogonal to the thickness direction,
   the circuit board is disposed in the recessed portion so as to have a space relative to the inner surface of the recessed portion,
   the photoelectric cell is bonded, in the recessed portion, to the upper surface of the circuit board, and
   a heat insulating material is disposed between the lower surface of the photoelectric cell and the bottom surface of the recessed portion.

4. The temperature measuring mask according to claim 3, wherein
   the energy beam is a charged particle beam that is emitted in the charged particle beam lithography device, and
   the temperature measuring mask further comprises a shielding portion shielding the photoelectric cell.

5. The temperature measuring mask according to claim 4, wherein a ground of the photoelectric cell is electrically connected to a contact relative to a conductive mask cover that eliminates static electricity on a mask blank.

6. The temperature measuring mask according to claim 2, wherein
   the energy beam is a charged particle beam that is emitted in the charged particle beam lithography device, and
   the temperature measuring mask further comprises a shielding portion shielding the photoelectric cell.

7. The temperature measuring mask according to claim 6, wherein a ground of the photoelectric cell is electrically connected to a contact relative to a conductive mask cover that eliminates static electricity on a mask blank.

8. The temperature measuring sensor according to claim 1, wherein
   a through hole penetrating through the substrate in the thickness direction is provided in the substrate, and
   the photoelectric cell and the circuit board are disposed in the through hole.

9. The temperature measuring sensor according to claim 8, wherein
   the circuit board is disposed at one end of the inside of the through hole, and
   the photoelectric cell is disposed at the other end of the inside of the through hole so as to be opposed to the circuit board.

10. The temperature measuring mask according to claim 9, wherein
    the energy beam is a charged particle beam that is emitted in the charged particle beam lithography device, and
    the temperature measuring mask further comprises a shielding portion shielding the photoelectric cell.

11. The temperature measuring mask according to claim 10, wherein a ground of the photoelectric cell is electrically connected to a contact relative to a conductive mask cover that eliminates static electricity on a mask blank.

12. The temperature measuring mask according to claim 8, wherein
    the energy beam is a charged particle beam that is emitted in the charged particle beam lithography device, and
    the temperature measuring mask further comprises a shielding portion shielding the photoelectric cell.

13. The temperature measuring mask according to claim 12, wherein a ground of the photoelectric cell is electrically connected to a contact relative to a conductive mask cover that eliminates static electricity on a mask blank.

14. The temperature measuring mask according to claim 1, wherein
    the energy beam is a charged particle beam that is emitted in the charged particle beam lithography device, and
    the temperature measuring mask further comprises a shielding portion shielding the photoelectric cell.

15. The temperature measuring mask according to claim 14, wherein a ground of the photoelectric cell is electrically connected to a contact relative to a conductive mask cover that eliminates static electricity on a mask blank.

16. The temperature measuring mask according to claim 1, wherein
the energy beam is a charged particle beam that is emitted in the charged particle beam lithography device, and
the temperature measuring mask further comprises a shielding portion shielding the photoelectric cell.

17. The temperature measuring mask according to claim 16, wherein a ground of the photoelectric cell is electrically connected to a contact relative to a conductive mask cover that eliminates static electricity on a mask blank.

18. A temperature measuring method, comprising:
loading a temperature measuring mask to a charged particle beam lithography device, the temperature measuring mask comprising a substrate to which a temperature sensor, a secondary cell, a photoelectric cell, and a circuit board including a circuit are provided;
irradiating the photoelectric cell, which is disposed in a recessed portion provided on a surface of the substrate on a side that is opposite to another surface of the substrate on another side to which the temperature sensor is provided, with an energy beam to cause the photoelectric cell to generate electric power to charge the secondary cell;
sensing a temperature inside the charged particle beam lithography device by using the temperature sensor and outputting a temperature data signal; and
operating the circuit with electric power of the secondary cell and receiving the temperature data signal.

19. The temperature measuring method according to claim 18, wherein
the energy beam is a charged particle beam that is emitted in the charged particle beam lithography device, and
the photoelectric cell is shielded.

* * * * *